United States Patent
Bergdahl et al.

(10) Patent No.: US 9,264,008 B2
(45) Date of Patent: Feb. 16, 2016

(54) FILTER APPARATUS, A METHOD FOR FILTERING HARMONICS IN AN ELECTRICAL POWER TRANSMISSION OR DISTRIBUTION SYSTEM, AND SUCH A SYSTEM

(75) Inventors: Bernt Bergdahl, Ludvika (SE); Mats Hyttinen, Ludvika (SE); Niklas Modig, Täby (SE); Peter Holmberg, Ludvika (SE)

(73) Assignee: ABB TECHNOLOGY LTD, Zürich (CH)

( * ) Notice: Subject to any disclaimer, the term of this patent is extended or adjusted under 35 U.S.C. 154(b) by 0 days.

(21) Appl. No.: 14/398,936

(22) PCT Filed: Aug. 30, 2012

(86) PCT No.: PCT/EP2012/066818
§ 371 (c)(1),
(2), (4) Date: Dec. 8, 2014

(87) PCT Pub. No.: WO2013/178294
PCT Pub. Date: Dec. 5, 2013

(65) Prior Publication Data
US 2015/0092459 A1 Apr. 2, 2015

Related U.S. Application Data

(60) Provisional application No. 61/654,484, filed on Jun. 1, 2012.

(51) Int. Cl.
*H03H 7/01* (2006.01)
*H02M 1/12* (2006.01)
(Continued)

(52) U.S. Cl.
CPC .............. *H03H 7/0161* (2013.01); *H02J 3/01* (2013.01); *H02J 3/36* (2013.01); *H02M 1/126* (2013.01); *H03H 19/004* (2013.01); *H02M 1/12* (2013.01); *Y02E 40/40* (2013.01); *Y02E 60/60* (2013.01)

(58) Field of Classification Search
CPC .................... H03H 2001/0014; H03H 7/0161; H03H 19/004; H02M 1/126
USPC ...................... 333/174, 176; 363/39; 336/200
See application file for complete search history.

(56) References Cited

U.S. PATENT DOCUMENTS

| 4,769,751 A | 9/1988 | Schraudolph et al. |
| 5,568,042 A | 10/1996 | Nyberg et al. |

(Continued)

FOREIGN PATENT DOCUMENTS

| CN | 101022219 A | 8/2007 |
| CN | 201134672 Y | 10/2008 |

(Continued)

*Primary Examiner* — Benny Lee
*Assistant Examiner* — Rakesh Patel
(74) *Attorney, Agent, or Firm* — Birch, Stewart, Kolasch & Birch, LLP

(57) ABSTRACT

A filter apparatus includes at least one filter, each filter being tunable and including at least one capacitor arrangement. The capacitor arrangement includes a plurality of first capacitors, a plurality of second capacitors, and a plurality of switches. Each switch is switchable between a non-conducting mode and a conducting mode. The plurality of second capacitors and the plurality of switches are arranged to connect or disconnect the second capacitors on different potentials in order to tune the filter by adjusting the capacitance of the filter. An electrical power transmission or distribution system includes such a filter apparatus. A method is provided for filtering harmonics in an electrical power transmission or distribution system by means of such a filter apparatus.

20 Claims, 5 Drawing Sheets

(51) Int. Cl.
*H03H 19/00* (2006.01)
*H02J 3/01* (2006.01)
*H02J 3/36* (2006.01)

(56) References Cited

U.S. PATENT DOCUMENTS 6,175,219 B1 * 1/2001 Imamura et al. ............... 323/222
7,729,147 B1 * 6/2010 Wong et al. .................... 363/147
2005/0088254 A1 * 4/2005 Belk ............................... 333/174
2007/0237273 A1 10/2007 Tan et al.
2008/0129434 A1 * 6/2008 Khajehpour ................... 336/139

FOREIGN PATENT DOCUMENTS

| | | |
|---|---|---|
| CN | 101521382 A | 9/2009 |
| CN | 101630841 A | 1/2010 |
| CN | 102185323 A | 9/2011 |
| KR | 10-1007388 B1 | 1/2011 |
| TW | 201023217 A1 | 6/2010 |

* cited by examiner

FILTER APPARATUS, A METHOD FOR FILTERING HARMONICS IN AN ELECTRICAL POWER TRANSMISSION OR DISTRIBUTION SYSTEM, AND SUCH A SYSTEM

CROSS REFERENCE TO RELATED APPLICATIONS

This application is the National Phase of PCT International Application No. PCT/EP2012/066818, filed on Aug. 30, 2012, which claims priority under 35 U.S.C. 119(e) to U.S. Provisional Application No. 61/654,484, filed on Jun. 1, 2012, all of which are hereby expressly incorporated by reference into the present application.

TECHNICAL FIELD

The present invention relates to a filter apparatus and to a method for filtering harmonics in an electrical power transmission or distribution system. Further, the present invention relates to an electrical power transmission or distribution system comprising a filter apparatus.

BACKGROUND

A High Voltage Direct Current (HVDC) power distribution network or an HVDC power transmission or distribution system uses direct current (DC) for the transmission or distribution of electrical power, in contrast to the more common alternating current (AC) systems. For long-distance transmission or distribution, HVDC systems may be less expensive and may suffer lower electrical losses. However, HVDC systems may also be used for short-distance transmission or distribution. In general, an HVDC power transmission or distribution system comprises at least one direct current transmission or distribution line, e.g. a long-distance HVDC link or cable for carrying direct current a long distance, e.g. under sea, and converters, or converter stations, for converting alternating current to direct current for input to the HVDC power transmission or distribution system and converters for converting direct current back to alternating current for input to a high voltage AC power system. An HVDC power transmission or distribution system may also be used as a back-to-back system for interconnecting two asyn-chronous AC networks, which may be remote to or in the proximity of one another. In a back-to-back system, the HVDC power transmission or distribution system may take electrical power from a first AC network, convert it into to direct current and transmit it to a second AC network, which may be remote to or in the proximity of the first AC network, where direct current is converted back to alternating current for input to the second AC network.

A converter connected to an AC power system, for example a converter included in a converter plant for high-voltage direct current, generates, by its principle of operation, harmonic currents on its AC side and harmonic voltages on its DC side. In this context, in principle, only harmonics to the fundamental frequency of the AC system of the orders $n=k\times p\pm 1$ occur on the AC side and of the orders $n=k\times p$ on the DC side, p being the pulse number of the converter and k being a positive integer. Harmonics of other orders may also occur in power systems of this kind, caused by, for example, un-symmetries between the phases of the AC system.

To reduce the stresses on components, e.g. generators and transformers, included in the electrical power transmission or distribution system, e.g. in the form of heating of the components, and originating from the harmonics, and to fulfill the requirements made on the effect on the electrical power transmission or distribution system and telecommunication disturbances, filters are generally installed to limit the propagation of the disturbances in the electrical power transmission or distribution system. Harmonics of a lower order, e.g. harmonics corresponding to $k=1$ and for 6-pulse converters also harmonics corresponding to $k=2$, are generally filtered through filters tuned to these harmonics, whereas harmonics of a higher order may be filtered through a high-pass filter. The filters are composed of pas-sive components, and during the dimensioning, it may also be taken into consider-ation that the filters on the AC side are to serve as members for generating reactive power. In general, however, the requirements for generation of reactive power in a converter plant for high voltage direct power may require the installation of one or more further high voltage capacitor banks on the AC side. In certain cases, it may be necessary to install tuned filters and high-pass filters also on the DC side of the converter. In a converter plant for high voltage direct current, the filters and the capacitor banks constitute plant components which essen-tially influence the function, volume and cost of the plant.

In general, the tuned filters are designed as series-reso-nance circuits, comprising capacitive, inductive and some-times also resistive impedance elements, tuned such that, at one or more of the harmonic frequencies expected in the electrical power transmission or distribution system, they are to exhibit purely resistive impedance.

In narrow-band filters, a small change of the reactance of an impedance element included in the filter may cause a consid-erable deterioration of the function of the filter. Such a change may, for example, be caused by a fault in one part of a capacitive impedance element.

Variations in the system frequency and drift in component values, caused by, for example, temperature variations or aging, makes it in general difficult to maintain a satisfactory, or exact, tuning although no direct faults occur in the filter, which in turn results in an impaired electric power transmis-sion or distribution and an impaired control thereof. One way to address variations in the system frequency and variations in component values is to make the filters broad enough to cope with the variations. It has also been proposed to provide tunable filters which provide an adjustment of the resonance frequency or frequencies of the filter.

KR 10-1007388 discloses a tunable band pass filter pro-vided to selectively filter a desired signal by band-pass filter-ing an amplified signal.

CN 102185323-A describes a reactive compensation con-troller comprising a mechanical thyristor-switched capacitor, the mechanical thyristor-switched capacitor comprising four groups of graded-compensation capacitors and a group of altogether-compensation capacitors.

U.S. Pat. No. 4,769,751 discloses simultaneous power and voltage control by a DC-tie between AC networks carried out by means of fixed and switchable inductive and capacitive compensation elements.

CN 101022219-A describes a device for eliminating har-monic waves and compensating power where a filter is con-nected to multiple AC contactors and capacitors by multiple switch sets.

CN 101630841-A discloses a dynamic harmonic filter comprising a capacitor group.

US 2007/0237273-A1 describes a complex filter with auto-matic tuning capabilities for filtering a complex signal. A tuning unit can generate a plurality of control signals to tune the complex filter to a predetermined frequency.

U.S. Pat. No. 5,568,042-A discloses monitoring and control of a filter in a power network. A tuning unit is disclosed, which comprises a reactor and four capacitors. The number of capacitors which are connected in series with the reactor may be controlled by means of switching members in the form of mechanical contacts.

SUMMARY

An object of the present invention is to provide an apparatus and a method which allow for improved filtering in an electrical power transmission or distribution system.

The above-mentioned object of the present invention is attained by providing a filter apparatus comprising at least one filter. Each filter is tunable and comprises at least one capacitor arrangement. The capacitor arrangement comprises a plurality of first capacitors, a plurality of second capacitors, and a plurality of switches. Each switch is switchable between a non-conducting mode and a conducting mode. The plurality of second capacitors and the plurality of switches are arranged to connect or disconnect the second capacitors on different potentials in order to tune the filter by adjusting the capacitance of the filter.

The at least one filter may be configured for harmonic filtering. By means of the filter apparatus according to the present invention, an improved filtering in an electrical power transmission or distribution system is provided. The filtering is improved in that a filter is provided that has a sufficiently small size, is efficient with regard to manufacturing and installation, and has the required filter performance. The installation of the filter is efficient and facilitated in that the filter takes up less space because of its reduced size, e.g., and thus is more cost efficient. The manufacturing of the filter is efficient and facilitated in that standardized components may be used, whereby the manufacturing costs are reduced. The required and efficient filter performance is inter alia attained by an improved tuning provided by the filter apparatus. By means of the improved tuning of the filter, an improved filtering of harmonics in an electrical power transmission or distribution system is provided. The harmonics may be generated by a converter or converter stations, or may occur or be generated elsewhere in the electrical power transmission or distribution system or network. By means of the improved filtering, an improved electric power transmission or distribution in an electrical power transmission or distribution system and an improved control of the electric power transmission or distribution are provided. By means of the improved tuning of the filter according to the present invention, a tunable filter with sharp impedance and a relatively high Q-value is provided. The tuning frequency of the filter may be adjusted or altered step-by-step, or in alternative words, in consecutive steps. By means of the filter apparatus according to embodiments of the present invention, the capacitance of the filter may be efficiently adjusted in order to compensate for temperature variations in components and system frequency changes. The capacitance of the filter can be efficiently adjusted in steps, and the tuning frequency of the filter can thus be efficiently adjusted in steps.

In addition to the capacitors of the capacitor arrangement, each filter may comprise one or a plurality of additional capacitors. Said plurality of first capacitors may be connected in series with one another.

According to an embodiment of the filter apparatus according to the present invention, the capacitor arrangement comprises a series connection of the plurality of first capacitors, wherein the plurality of second capacitors and the plurality of switches are arranged to connect or disconnect the second capacitors to the series connection of the plurality of first capacitors on different potentials. By means of this embodiment, the adjustment of the capacitance of the filter is further facilitated, and an improved tuning of the filter and an improved filtering are provided.

According to a further embodiment of the filter apparatus according to the present invention, the capacitor arrangement comprises a plurality of parallel connections connected in series with one another, and each parallel connection comprises a first capacitor of the plurality of first capacitors and at least one series connection of at least one second capacitor of the plurality of second capacitors and of a switch of the plurality of switches, and in each parallel connection the first capacitor being connected in parallel with the at least one series connection of at least one second capacitor and of a switch. By means of this embodiment, the adjustment of the capacitance of the filter is further improved, and a further improved tuning of the filter and a further improved filtering are provided.

According to another embodiment of the filter apparatus according to the present invention, the first capacitors have substantially the same capacitance. By means of this embodiment, the capacitance of the capacitor arrangement can be efficiently adjusted in steps, and the tuning frequency of the filter can thus be efficiently adjusted in steps, whereby further improved tuning of the filter and a further improved filtering are provided.

According to still another embodiment of the filter apparatus according to the present invention, the second capacitors have substantially the same capacitance. By means of this embodiment, the capacitance of the capacitor arrangement can be efficiently adjusted in steps, and the tuning frequency of the filter can thus be efficiently adjusted in steps, whereby a further improved tuning of the filter and a further improved filtering of harmonics are provided. In general, when a second capacitor has been disconnected by means of the switch, the disconnected second capacitor should be discharged, which may take a certain amount of time, before being connected again. By having second capacitors with substantially the same capacitance, one may connect any of the second capacitors to attain a specific adjustment of the capacitance of the capacitor arrangement, and one may thus connect a second capacitor that has been sufficiently discharged, whereby any delay in the capacitance adjustment is avoided. In addition, each of the second capacitors does not need to have a fast discharge time, which allows for de-signing the second capacitors with lower losses, especially in comparison with the alternative capacitor arrangement of FIG. 7 in the appended drawings.

According to an embodiment of the filter apparatus according to the present invention, the capacitance of each first capacitor is different from the capacitance of each second capacitor. By means of this embodiment, the adjustment of the capacitance of the filter is facilitated, and a further improved tuning of the filter and a further improved filtering are provided.

According to a further embodiment of the filter apparatus according to the present invention, each filter comprises at least one adjustable reactor connected in series with the capacitor arrangement, the inductance of the at least one adjustable reactor being adjustable, and the adjustable reactor is arranged to adjust the inductance of the filter. By means of this embodiment, the inductance of the filter can be efficiently adjusted in steps, and the tuning frequency of the filter can thus be efficiently adjusted in steps, whereby a further improved tuning of the filter and a further improved filtering of harmonics are provided. In addition to the at least one adjustable reactor, each filter may comprise one or a plurality of additional reactors.

According to another embodiment of the filter apparatus according to the present invention, the filter apparatus comprises a controller arranged to increase the capacitance of the filter by controlling the filter to connect at least one of the second capacitors of the plurality of second capacitors. By means of this embodiment, the adjustment of the capacitance of the filter is facilitated, and a further improved tuning of the filter and a further improved filtering are provided.

According to still another embodiment of the filter apparatus according to the present invention, the controller is arranged to select which at least one of the second capacitors to connect based on information on when at least one of the second capacitors was last connected. By means of this embodiment, the adjustment of the capacitance of the filter is further facilitated, and a further improved tuning of the filter and a further improved filtering are provided. When a second capacitor has been disconnected by means of the switch, the disconnected second capacitor should be discharged, which may take a certain amount of time, before being connected again. Based on the information on when at least one of the second capacitors was last connected, one may thus connect a second capacitor that has been disconnected a longer time and thus has had more time to discharge. Thus, this embodiment allows for a selection of a second capacitor that has had time to discharge. In addition, each of the second capacitors does not need to have a fast discharge time.

According to yet another embodiment of the filter apparatus according to the present invention, the filter apparatus comprises a controller arranged to decrease the capacitance of the filter by controlling the filter to disconnect at least one of the second capacitors of the plurality of second capacitors. By means of this embodiment, the adjustment of the capacitance of the filter is facilitated, and a further improved tuning of the filter and a further improved filtering are provided. The controller arranged to decrease the capacitance of the filter and the controller arranged to increase the capacitance of the filter may be one and the same controller.

According to an embodiment of the filter apparatus according to the present invention, the controller is arranged to switch at least one switch of the plurality of switches to the conducting mode to increase the capacitance of the capacitor arrangement for adjusting the tuning frequency of the filter, and the controller is arranged to switch at least one switch of the plurality of switches to the non-conducting mode to decrease the capacitance of the capacitor arrangement for adjusting the tuning frequency of the filter. By means of this embodiment, the adjustment of the capacitance of the filter is facilitated, and a further improved tuning of the filter and a further improved filtering are provided.

According to a further embodiment of the filter apparatus according to the present invention, the controller is arranged to consecutively switch one or a plurality of the switches to the conducting mode for increasing the capacitance of the capacitor arrangement, and the controller is arranged to consecutively switch one or a plurality of the switches to the non-conducting mode for decreasing the capacitance of the capacitor arrangement. By means of this embodiment, the capacitance of the filter can be efficiently adjusted in steps, and the tuning frequency of the filter can thus be efficiently adjusted in steps, whereby a further improved filtering is provided.

According to another embodiment of the filter apparatus according to the present invention, the filter apparatus is arranged to increase the capacitance of the capacitor arrangement by 1-5%, e.g. 1-3%, or even 1-2%, when one of the switches is switched to the conducting mode, and the filter apparatus is arranged to decrease the capacitance of the capacitor arrangement by 1-5%, e.g. 1-3%, or even 1-2%, when one of the switches is switched to the non-conducting mode. By means of this embodiment, the capacitance of the filter can be efficiently adjusted in steps, and the tuning frequency of the filter can thus be efficiently adjusted in steps, whereby a further improved filtering of harmonics are provided.

The above-mentioned object of the present invention is also attained by providing an electrical power transmission or distribution system comprising at least one converter for converting alternating current, AC, to direct current and/or direct current to alternating current, the at least one converter being connectable to a high voltage direct current, HVDC, power transmission or distribution system comprising at least one direct current transmission or distribution line for carrying direct current, DC, and connectable to a high voltage alternating current, AC, power system, wherein the electrical power transmission or distribution system comprises at least one filter apparatus as claimed in any of the claims 1 to 14, and/or at least one filter apparatus according to any of the herein disclosed embodiments of the filter apparatus. Positive technical effects of the electrical power transmission or distribution system according to the present invention, and its embodiments, correspond to the technical effects mentioned in connection with the filter apparatus according to the present invention, and its embodiments.

The electrical power transmission or distribution system may comprise the HVDC power transmission or distribution system. The electrical power transmission or distribution system may comprise the high voltage AC power system.

Further, the above-mentioned object of the present invention is also attained by providing a method for filtering harmonics in an electrical power transmission or distribution system by means of a filter apparatus as claimed in any of the claims 1 to 14, and/or a filter apparatus according to any of the herein disclosed embodiments of the filter apparatus, and wherein the method comprises tuning the at least one filter by connecting or disconnecting the second capacitors on different potentials in order to adjust the capacitance of the filter.

According to an embodiment of the method according to the present invention, the step of tuning the at least one filter comprises switching at least one of the switches to the conducting mode to increase the capacitance of the capacitor arrangement or to the non-conducting mode to decrease the capacitance of the capacitor arrangement.

Positive technical effects of the method according to the present invention, and its embodiments, correspond to the technical effects mentioned in connection with the filter apparatus according to the present invention, and its embodiments.

The features and embodiments of the filter apparatus, the electrical power transmission or distribution system and the method, respectively, may be combined in various possible ways providing further embodiments.

Further embodiments of the filter apparatus, the electrical power transmission or distribution system and the method, respectively, according to the present invention and further advantages with the present invention emerge from the detailed description of embodiments.

BRIEF DESCRIPTION OF THE DRAWINGS

The present invention will now be described, for exemplary purposes, in more detail by way of embodiments and with reference to the enclosed drawings, in which.

DETAILED DESCRIPTION

Figure 1:
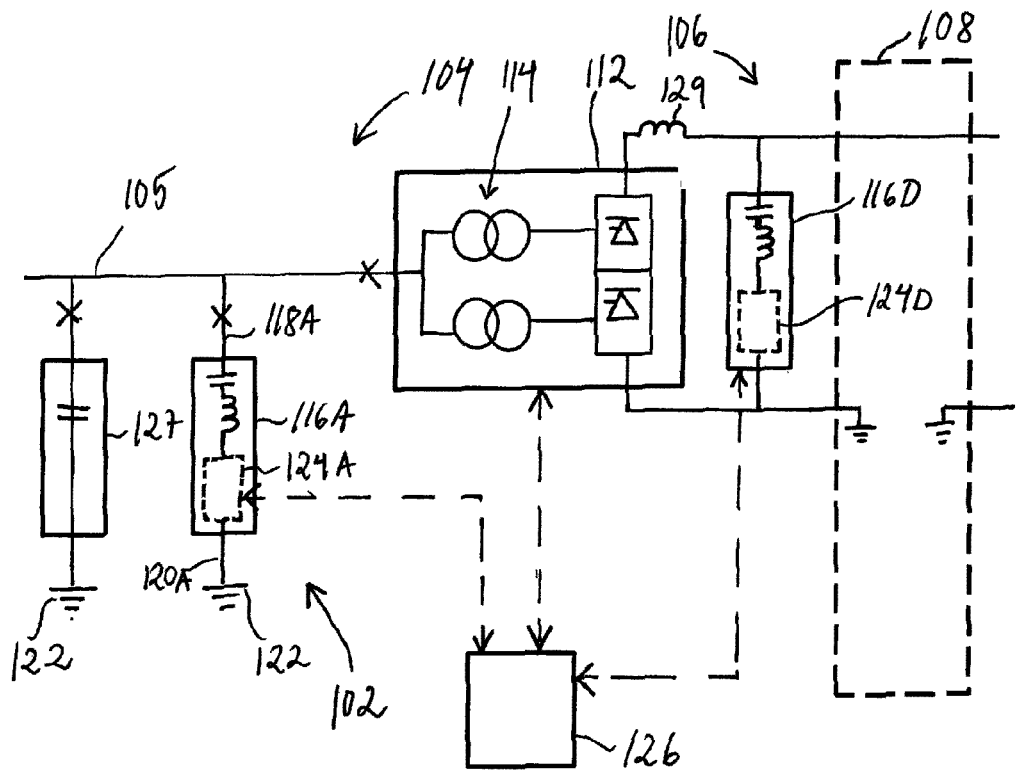
FIG. 1 is a schematic diagram illustrating aspects of the filter apparatus and aspects of the electrical power transmission or distribution system according to an embodiment of the present invention.

FIG. 1 schematically illustrates aspects of the filter apparatus 102 and of the electrical power transmission or distribution system according to an embodiment of the present invention. The electrical power transmission or distribution system may comprise a high voltage alternating current, AC, power system 104, which may be a three-phase high voltage alternating current, AC, power system. The AC power system 104 may comprise at least one AC line or bus 105. Further, the electrical power transmission or distribution system may comprise a high voltage direct current, HVDC, power transmission or distribution system 106 comprising at least one HVDC transmission or distribution line 108, e.g. a cable, for carrying direct current, DC. The HVDC power transmission or distribution system 106 may be adapted for single phase power or multi-phase power, e.g. three-phase power, and the components of the system and the filter apparatus may be configured accordingly in ways known to the skilled person. The electrical power transmission or distribution system may comprise at least one converter 112, which also may be called a converter station, for converting alternating current to direct current and/or direct current to alternating current. The at least one converter 112 may be connectable, or connected, to the HVDC power transmission or distribution system 106 and connectable, or connected, to the AC power system 104. The converter 112 may comprise a transformer connection 114. The AC power system 104 may be connected via the converter 112, and the transformer connection 114, to the HVDC power transmission or distribution system 106. The AC power system 104 may have an electric fundamental frequency. The transformer connection 114 may in a known manner comprise a Y-Y and a Y-Δ connected transformer for the case where the converter 112 is designed as a 12-pulse connection. The filter apparatus 102 comprises at least one tunable filter 116A. For a multi-phase high voltage AC power system, the filter apparatus 102 may comprise at least one filter for each phase. The at least one filter 116A may be connectable to the electrical power transmission or distribution system. The at least one filter 116A may be connectable to at least one phase of the high voltage AC power system 104, e.g. by being connected by one of its terminals 118A to one phase of the AC power system 104 and by its other terminal 120A to ground 122. The filter apparatus 102 may comprise another tunable filter 116D which may be connected, or connectable, to the at least one HVDC line 108 of the HVDC power transmission or distribution system 106. However, the second filter 116D may be excluded from the electrical power transmission or distribution system. The AC power system 104 may comprise a shunt capacitor 127, e.g. connected to the AC bus 105, and the HVDC power transmission or distribution system 106 may comprise a smoothing reactor 129.

Instead of a high voltage AC power system for three-phase power, the electrical power transmission or distribution system may comprise a high voltage AC power system adapted for single phase power or two-phase power, and the components of the system may be configured accordingly in ways known to the skilled person.

Each filter 116A, 116D may comprise at least one arrangement 124A, 124D of at least one capacitor arrangement 128a; 128b (see FIGS. 5 and 6) for tuning the filter 116A, 116D, which is further disclosed hereinafter. The filters 116A, 116D may be configured in the same manner. The filter apparatus 102 may comprise a controller 126 for controlling the filter 116A, 116D. The filter apparatus 102 may comprise a separate controller for each filter 116A, 116D instead of a common controller 126.

Figure 2:
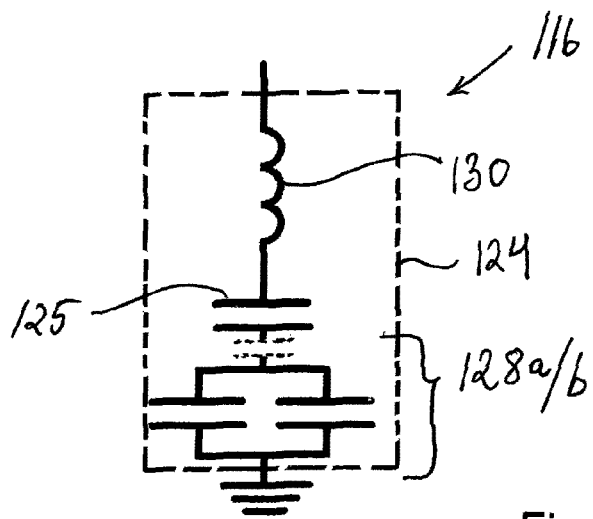
FIG. 2 a schematic diagram illustrating a first embodiment of the filter included in the filter apparatus according to the present invention.
Figure 3:
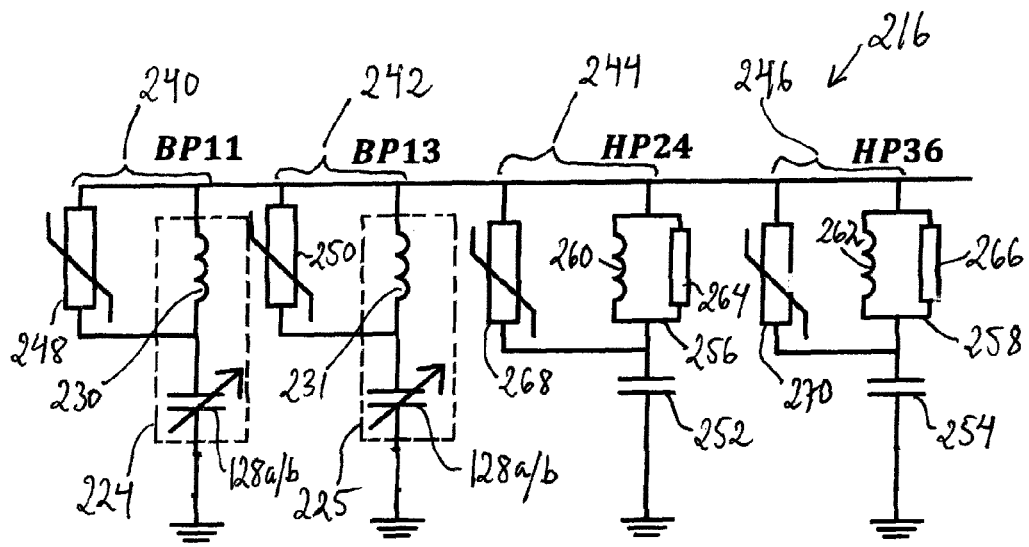
FIG. 3 a schematic diagram illustrating a second embodiment of the filter included in the filter apparatus according to the present invention.
Figure 4:
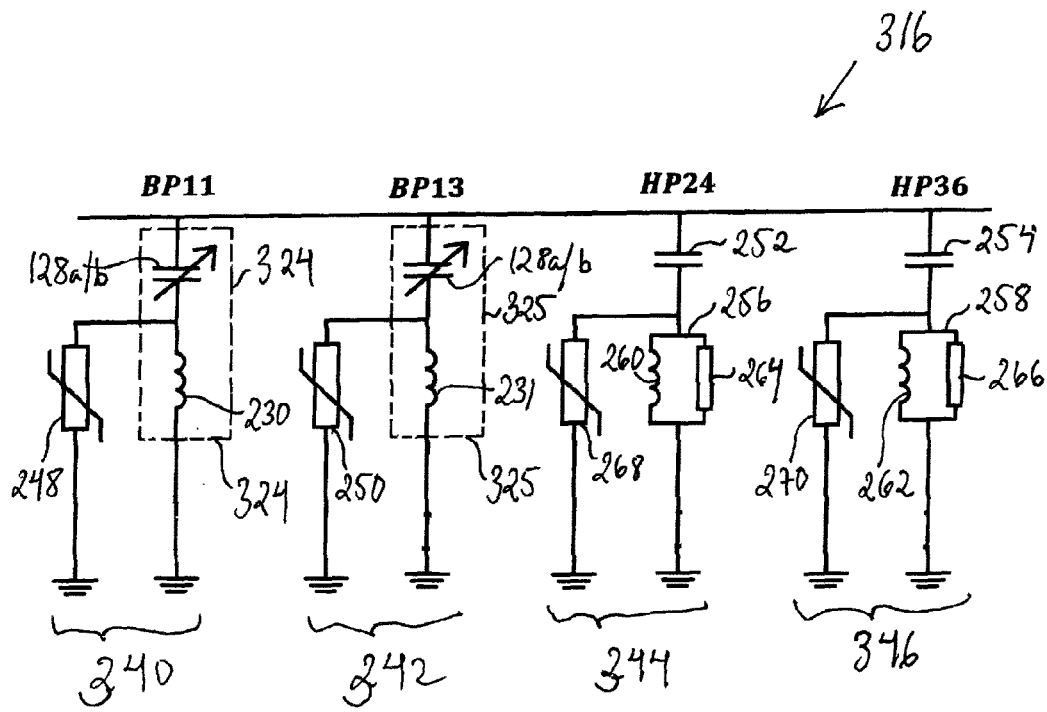
FIG. 4 a schematic diagram illustrating a third embodiment of the filter included in the filter apparatus according to the present invention.

FIGS. 2 to 4 schematically illustrate embodiments of a tunable filter 116, 216, 316 which may be included in the filter apparatus 102 as illustrated in FIG. 1. Each filter 116; 216; 316 may be configured for harmonic filtering. Harmonics may be generated by the at least one converter 112, or may occur or be generated elsewhere in the electrical power transmission or distribution system. Each filter 116; 216; 316 may comprise at least one capacitor arrangement 128a; 128b for adjusting the capacitance of the filter 116, 216, 316. Each filter 116; 216; 316 may comprise at least one reactor 130; 230, 231, or inductor, connected in series with the capacitor arrangement 128a; 128b. The at least one capacitor arrangement 128a; 128b and the at least one reactor 130; 230, 231 may form an arrangement 124; 224, 225; 324, 325 for tuning the filter. Each filter 116, 216, 316 may comprise at least one arrangement 124; 224, 225; 324, 325 of at least one capacitor arrangement 128a; 128b and of at least one reactor 130; 230, 231, i.e. one or a plurality of such arrangements 124; 224, 225; 324, 325. The filter 116 of FIG. 2 may comprise one arrangement 124 of a capacitor arrangement 128a/b and of a reactor 130. The filter 216 of FIG. 3 may comprise two arrangements 224, 225 of a capacitor arrangement 128a/b and of a reactor 230, 231. The filter 316 of FIG. 4 may comprise two arrangements 324, 325 of a capacitor arrangement 128a/b and of a reactor 230, 231.

Figure 5:
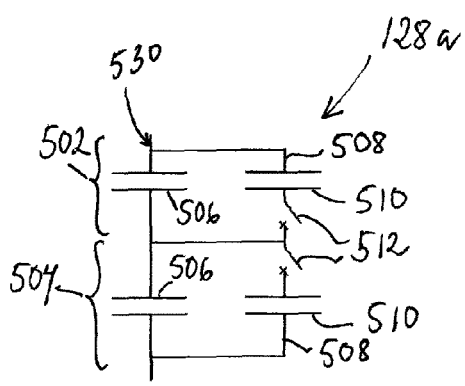
FIG. 5 is a schematic diagram illustrating aspects of the capacitor arrangement included in the filter apparatus according to the present invention.
Figure 6:
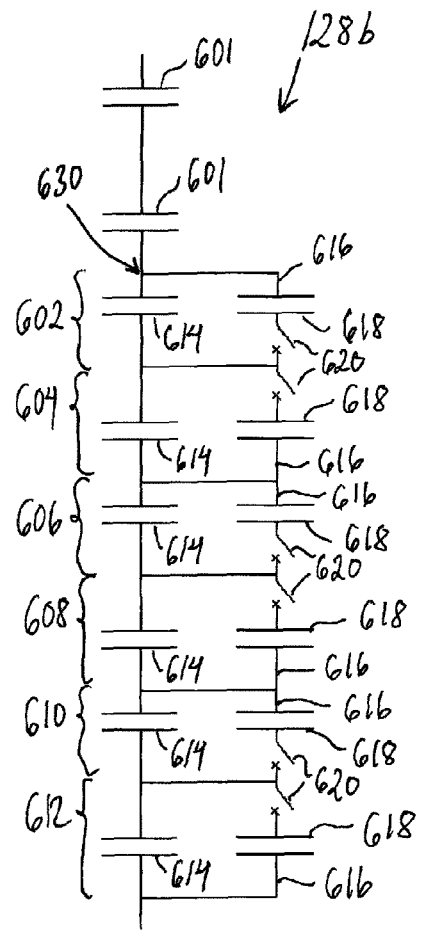
FIG. 6 is a schematic diagram illustrating further aspects of the capacitor arrangement included in the filter apparatus according to the present invention and aspects of the method according to the present inventions.

With reference to FIG. 2, in addition to the arrangement 124 of a capacitor arrangement 128a/b and of a reactor 130, the filter 116 may be provided with one or a plurality of additional reactors and/or one or a plurality of additional capacitors 125 (see also 601 in FIG. 6). By means of suitable choices of inductance values and capacitance values, respectively, for the reactor 130 and the capacitor arrangement 128a/b, the filter 116 may be tuned to a specific frequency. It is to be noted that in FIG. 2 the capacitor arrangement 128a/b is schematically illustrated and reference is made to FIGS. 5 and 6 for a more detailed illustration.

With reference to FIG. 3, the second embodiment of the filter 216 comprises four branches 240, 242, 244, 246, also denoted by BP11, BP13, HP24 and HP36. Each of the first and second branches 240, 242 may comprise an arrangement 224, 225 of a capacitor arrangement 128a/b and of a reactor 230, 231, whereas the third and fourth branches 244, 246 do not include a corresponding arrangement. Each of the first and second branches 240, 242 may comprise an arrester 248, 250 connected in parallel with the reactor 230, 231 to protect the reactor 230, 231 from lightning and switching impulses. Each of the third and fourth branches 244, 246 may comprise a fixed capacitor bank 252, 254 connected in series with a parallel connection 256, 258 of a reactor 260, 262 and of a resistor 264, 266. Each of the third and fourth branches 244, 246 may also comprise an arrester 268, 270 connected in parallel with the parallel connection 256, 258 to protect the reactor 260, 262 from lightning and switching impulses. Each of the capacitor arrangements 128a/b and the capacitor banks, 252, 254 may be located between the reactor 230, 231, 260, 262 of the associated branch and ground.

In addition to the capacitor arrangements 128a/b, the capacitor banks 252, 254 and the reactors 230, 231, 260, 262 illustrated in FIG. 3, the filter 216 may be provided with one or a plurality of additional reactors and/or one or a plurality of additional capacitors. By means of suitable choices of inductance values and capacitance values, respectively, for the reactors 230, 231, 260, 262, the capacitor arrangements and the capacitor banks 128a/b, 252, 254 of the branches 240, 242, 244, 246, the filter 216 may tuned to four separate frequencies. Thus, the first branch 240 may be tuned to the harmonic of order 11, the second branch 242 may be tuned to the harmonic of order 13, and the third and fourth branches 244, 246 may provide high-pass filter function and be tuned to higher order harmonics. An advantage of the embodiment of FIG. 3 is that the structure of the filter 216 takes up a relatively small ground area, i.e. has a relatively small horizontal extension.

FIG. 4 schematically illustrates a third embodiment of the filter 316 comprising four branches 340, 342, 344, 346, also denoted by BP11, BP13, HP24 and HP36. The third embodiment of the filter 316 may essentially correspond to the second embodiment of the filter 216, with the difference that in each branch the capacitor arrangement or capacitor bank 128a/b, 252, 254 is not located between the reactor 230, 231, 260, 262 and ground as in the second embodiment of the filter 216. Thus, the arrangements 324, 325 of a capacitor arrangement 128a/b and of a reactor 230, 231 of FIG. 4 have a slightly different configuration in relation to the arrangements 224, 225 of FIG. 3. An advantage of the embodiment of FIG. 4 is that the structure of the filter 236 is low in height, i.e. has a relatively small verti-cal extension.

The reactor 130; 230, 231 of the arrangement 124; 224, 225; 324, 325 of at least one capacitor arrangement 128a; 128b and of at least one reactor 130; 230, 231, or any of the other reactors mentioned above, may be an adjustable reactor 130; 230, 231. The adjustable reactor 130; 230, 231 is adjustable in that the inductance of the adjustable reactor 130; 230, 231 is adjustable. The adjustable reactor 130; 230, 231 is arranged to adjust the inductance of the filter 116; 216; 316. The inductance of the adjustable reactor 130; 230, 231 may be adjustable by being provided with a tap changer, e.g. an on-load tap changer, whereby the number of electrical turns in the winding of the adjustable reactor 130; 230, 231 may be changed. Adjustable reactors having a tap changer are well known to the person skilled in the art and are thus not discussed in further detail. Other adjustable reactors are possible.

Figure 7:
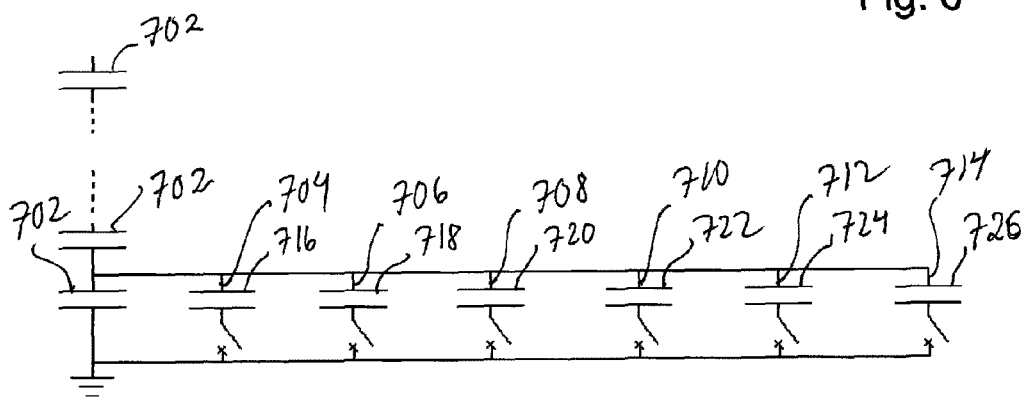
FIG. 7 is a schematic diagram illustrating an alternative capacitor arrangement, which may be included in the filter apparatus.

With reference to FIGS. 5-7, two embodiments of the capacitor arrangement 128a/b of the filter apparatus 102 according to the present invention and an alternative capacitor arrangement 728 are schematically illustrated.

With reference to FIGS. 5 and 6, each capacitor arrangement 128a; 128b shown comprises a plurality of first capacitors 506; 614, a plurality of second capacitors 510; 618 and a plurality of switches 512; 620, each switch 512; 620 being switchable between a non-conducting mode and a conducting mode. The plurality of first capacitors 506; 614 may be connected in series with one another. The plurality of second capacitors 510; 618 and the plurality of switches 512; 620 are arranged to connect or disconnect the second capacitors 510; 618 on different potentials in order to tune the filter 116; 216; 316 by adjusting the capacitance of the filter 116; 216; 316. Each capacitor arrangement 128a; 128b may comprise a series connection 530; 630 of the plurality of first capacitors 506; 614, and the plurality of second capacitors 508; 618 and the plurality of switches 512; 620 may be arranged to connect or disconnect the second capacitors 508; 618 to the series connection 530; 630 of the plurality of first capacitors 506; 614 on different potentials. Thus, the plurality of first capacitors 506; 614 may be connected in series with one another. Each switch 512; 620 may be supplied by power by making use of the voltage across the first capacitor 506; 614. A transformer may be used to transform the high voltage across the first capacitor 506; 614 to a lower level, e.g. down to 120 or 240 V. One transformer may feed two switches on the same level. By means of an optical converter compatible with the switch 512; 620, the control current can be efficiently connected to the switches 512; 620, and thus, control signals may be transmitted by means of light guides.

With reference to FIG. 5, the first embodiment of the capacitor arrangement 128a may comprise a plurality of parallel connections 502, 504, e.g. two parallel connections 502, 504 as shown in FIG. 5, connected in series with one another. Each parallel connection 502, 504 may comprises a first capacitor 506 of the plurality of first capacitors 506 and at least one series connection 508 of at least one second capacitor 510 of the plurality of second capacitors and of a switch 512 of the plurality of switches. In each parallel connection 502, 504 the first capacitor 506 is connected in parallel with the at least one series connection 508 of at least one second capacitor 510 and of a switch 512. The first capacitors 506 may have substantially the same capacitance, or alternatively, different capacitances. The second capacitors 510 may have substantially the same capacitance, or alternatively, different capacitances. The capacitance of each first capacitor 506 may be different from the capacitance of each second capacitor 510. The at least one reactor 130; 230, 231 of FIGS. 2-4 may be connected in series with the capacitor arrangement 128a, i.e. in series with the plurality of parallel connections 502, 504. One or a plurality of the series connections 508 may comprise a plurality of second capacitors. Each of the first capacitors 506 may be a fixed capacitor. One or a plurality of the parallel connections may comprise a plurality of series connections configured as above and connected in parallel with the first capacitor.

With reference to FIG. 6, the second embodiment of the capacitor arrangement 128b comprises a plurality of parallel connections 602, 604, 606, 608, 610, 612, e.g. six parallel connections as shown in FIG. 6, connected in series with one another. However, the capacitor arrangement 128b may comprise more parallel connections or fewer parallel connections.

Thus, the capacitor arrangement 128b may comprise at least three parallel connections, or at least four parallel connections, or at least five parallel connections, or at least six parallel connections, or more, connected in series with one another. By providing more parallel connections, i.e. more first capacitors and more second capacitors, the capacitance of the capacitor arrangement may be changed according to a wider range, and consequently, the tuning frequency of the filter can be adjusted according to a wider range, providing a further improved tuning of the filter. Further, more parallel connections than what is required during normal operation may be provided for redundancy requirements or reasons, i.e. in order to have a backup if one switch or a plurality of switches fails, or one second capacitor or a plurality of second capacitors fails. Each parallel connection 602, 604, 606, 608, 610, 612 comprises a first capacitor 614 connected in parallel with at least one series connection 616 of at least one second capacitor 618 and of a switch 620. The first capacitors 614 may have substantially the same capacitance, or alternatively, different capacitances. The second capacitors 618 may have substantially the same capacitance, or alternatively, different capacitances. The capacitance of each first capacitor 614 may be different from the capacitance of each second capacitor 618. The at least one reactor 130; 230, 231 of FIGS. 2-4 may be connected in series with the plurality of parallel connections 602, 604, 606, 608, 610, 612. One or a plurality of the series connections 616 may comprise a plurality of second capacitors. Each of the first capacitors 614 may be a fixed capacitor. One or a plurality of the parallel connections may comprise a plurality of series connections configured as above and connected in parallel with the first capacitor.

According to one alternative, in at least one filter, a capacitor 506, 510; 614, 618 of the capacitor arrangement 128a; 128b could be replaced by a reactor.

With reference to FIGS. 5-6, the second capacitors 510; 618 are connected or disconnected on different potentials. Thus, the switches 512; 620 may be connected or disconnected on different potentials. The series connection 530; 630 of the first capacitors 506; 614 may be configured for the lowest desired capacitance of the capacitor arrangement 128a/b. The series connection 530; 630 of the first capacitors 506; 614 may be configured so that the capacitance of the series connection 530; 630 of the first capacitors 506; 614 corresponds to the capacitance requested for the highest frequency for which the filter 116, 216, 316 shall compensate. Each switch 512; 620 may be a vacuum switch, or any other switch. Switches for high voltages application are well known to the person skilled in art and are thus not discussed in more detailed. Each switch 512; 620 may be located before or after the second capacitor 510; 618 of the associated series connection 508; 616. Each first capacitor 506; 614 may be called a main capacitor, and each second capacitor 510; 618 may be called a tuning capacitor.

The above-mentioned controller 126 may be arranged to increase the capacitance of the filter 116, 216, 316 by controlling the filter 116, 216, 316 to connect at least one of the second capacitors 510; 618 of the plurality of second capacitors 510; 618. The controller 126 may be arranged to decrease the capacitance of the filter 116, 216, 316 by controlling the filter 116, 216, 316 to disconnect at least one of the second capacitors 510; 618 of the plurality of second capacitors 510; 618. The controller 126 may be arranged to select which at least one of the second capacitors 510; 618 to connect based on information on when at least one of the second capacitors 510; 618 was last connected. The controller 126 may be arranged to select which at least one of the second capacitors to connect based on information on when a plurality of the second capacitors 510; 618 was last connected, or information on when each of the second capacitors 510; 618 was last connected. The controller 126 may be arranged to switch at least one switch of the plurality switches 512; 614 to the conducting mode to increase the capacitance of the capacitor arrangement 128a/b for adjusting the tuning frequency of the filter 116, 216, 316, and the controller 126 may be arranged to switch at least one switch of the plurality of switches 512; 614 to the non-conducting mode to decrease the capacitance of the capacitor arrangement 128a/b for adjusting the tuning frequency of the filter 116, 216, 316. The controller 126 may be arranged to consecutively switch one or a plurality of the switches 512; 614 to the conducting mode to increase the capacitance of the capacitor arrangement 128a/b for adjusting the tuning frequency of the filter 116, 216, 316, and the controller 126 may be arranged to consecutively switch one or a plurality of the switches 512; 614 to the non-conducting mode to decrease the capacitance of the capacitor arrangement 128a/b for adjusting the tuning frequency of the filter 116, 216, 316. The controller 126 may be arranged to switch each switch 512; 614 to the conducting mode in a synchronized manner when its associated second 510; 618 is discharged, i.e. when there is a current or voltage zero crossing in the series connection.

The filter apparatus 102 may be arranged to increase the capacitance of the capacitor arrangement 128a/b by 1-5%, e.g. 1-3%, or even 1-2%, when one of the switches 512; 614 is switched to the conducting mode, and the filter apparatus 120 may be arranged to decrease the capacitance of the capacitor arrangement 128a/b by 1-5%, e.g. 1-3%, or even 1-2%, when one of the switches 512; 614 is switched to the non-conducting mode.

With reference to FIG. 7, an alternative capacitor arrangement 728 is schematically illustrated. The capacitor arrangement 728 of FIG. 7 comprises a plurality of the first capacitors 702 connected in series, wherein one of the first capacitors 702 is connected in parallel with a plurality of series connections 704, 706, 708, 710, 712, 714 of at least one second capacitor 716, 718, 720, 722, 724, 726 and of a switch 718 switchable between a non-conducting mode and a conducting mode. The second capacitors 716, 718, 720, 722, 724, 726 may have different capacitances. The first capacitor 702 connected between ground and a neigh-bouring first capacitor may be the capacitor that is connected in parallel with the plurality of series connections 704, 706, 708, 710, 712, 714. Since a disconnected second capacitor 716, 718, 720, 722, 724, 726 should be discharged before being connected again, some of the second capacitors 716, 718, 720, 722, 724, 726 may be designed to have a greater internal resistance to discharge more quickly. The capacitor arrangement 728 of FIG. 7 may comprise more or fewer series connections.

Figure 8:
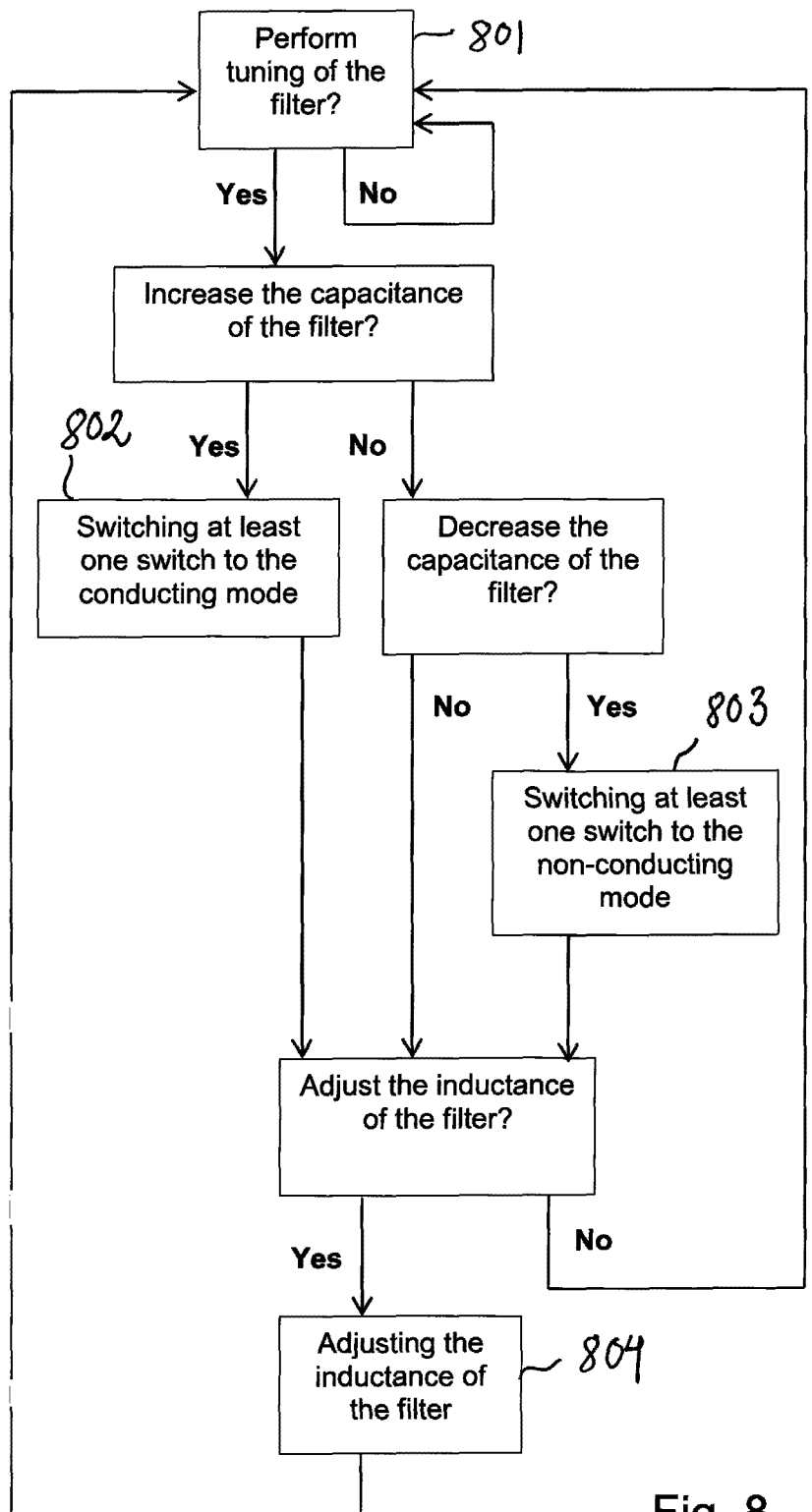
FIG. 8 is a flow diagram illustrating aspects of an embodiment of the method according to the present invention.

With reference to FIG. 8, aspects of the method for filtering harmonics in an electrical power transmission or distribution system by means of an embodiment of the filter apparatus 102 as disclosed in FIGS. 1-6, e.g., are schematically illustrated. The method comprises the stage of tuning the at least one filter 116; 216; 316 by connecting or disconnecting the second capacitors 510; 618 on different potentials in order to adjust the capacitance of the filter 116; 216; 316. The stage of tuning the at least one filter 116; 216; 316 may comprise adjusting the tuning frequency of the at least one filter. The stage of tuning the at least one filter may comprise switching at least one of the switches 512; 620 to the conducting mode to increase the capacitance of the capacitor arrangement 128a; 128b or to the non-conducting mode to decrease the capacitance of the capacitor arrangement 128a; 128b, as illustrated in FIG. 8. At step 801 in FIG. 8, it is determined whether to tune the filter or not. If determined to tune the filter, at least one of the switches 512; 620 is switched to the conducting mode to connect at least one of the second capacitors 510; 618 in order to increase the capacitance of the capacitor arrangement 128a; 128b, at step 802, or at least one of the switches 512; 620 is switched to the non-conducting mode to disconnect at least one of the second capacitors 510; 618 in order to decrease the capacitance of the capacitor arrangement, at step 803, or the capacitance of the capacitor arrangement is kept unchanged. Step 802 may include the step of selecting a second capacitor to be connected based on information on when each of the second capacitors was last connected. At step 804, the inductance of the at least one reactor is adjusted to adjust the inductance of the filter, or the inductance of the at least one reactor is kept unchanged.

The filter apparatus 102 may comprise at least one temperature sensor for measuring the temperature of the capacitor arrangement or of the region of the capacitor arrangement, i.e. the ambient temperature. The temperature sensor may be arranged to measure the temperature changes of the capacitor arrangement, e.g. in the dielectric material of the capacitors. The temperature measurements may be used, e.g. by the controller, to determine how much the capacitance of the capacitor arrangement will change, i.e. the capacitance change, due to a temperature change. The determination of the capacitance change may be at least partly based on the measured temperature and on the temperature characteristic of the capacitor arrangement. Knowing the initial capacitance at a given reference temperature, e.g. 20° C., it is possible to calculate the capacitance change, e.g. by subtracting the initial capacitance depending on the temperature from the determined current capacitance. The determined capacitance change can then be used, e.g. by the controller, to adjust the capacitance of the capacitor arrangement and thus the capacitance of the filter, by connecting or disconnecting at least one of the second capacitors, in order to tune the filter.

The fundamental frequency may be another control parameter to be used for adjusting the capacitance of the filter. By knowing the fundamental frequency, the correct value of the capacitance or inductance may be determined. The phase angle between the harmonic voltage across the filter and the harmonic current through the filter may be used as a control parameter in the adjustment of the capacitance of the filter. The voltage can e.g. be measured by a capacitive voltage transformer on the AC bus, in parallel with the AC filter, i.e. a filter placed on the AC side. The current can be measured by a current transformer at the bottom of the AC filter.

The filter may be controlled, e.g. by the controller or by a filter control system, in a plurality of different ways. One uncomplicated and robust way is to have an open loop control system. The open loop control system may be based on knowing both the temperature and fundamental frequency. The desired value $C_x$ for the capacitance can be calculated as:

$$C_x = \frac{1}{L*4*\pi^2*(N*f)^2} - \Delta C(° C.),$$

where:

$N$ = Order of specific filter harmonic, (e.g. 11 or 13)

$f$ = Fundamental frquency in the AC network.

Another way of controlling the filter is to use a closed loop control system. By determining the phase angle between the specific harmonic current through the filter and the specific harmonic voltage across the filter, the filter may be tuned in the right stage. The phase angle between the current and voltage for the tuning frequency in the filter is always zero when the filter is perfectly tuned. If the angle is starting to increase, the controller is informed that the filter is not tuned in an optimal, or best, way. An advantage by using the phase angle as a control parameter is that measurements of the temperature and frequency are not required. However, the correct and exact phase angle should be measured. The desired capacitance $C_x$ using the phase angle as a parameter can be calculated as:

$$C_x = \frac{1}{\omega^2 * L - R_l * \omega * \tan(-\varphi_x)},$$

where:

$\omega = 2 * \pi * N * 50$ $N$ = Order of the specific filter harmonic, (11 or 13)

$\varphi_x$ = Phase angle for the specific filter harmonic $R_l$ = Filter resistance $L$ = Initial inductance in the filter design.

However, in addition to the ways disclosed above, the filter may be controlled, e.g. by the controller, in other ways.

Figure 9:
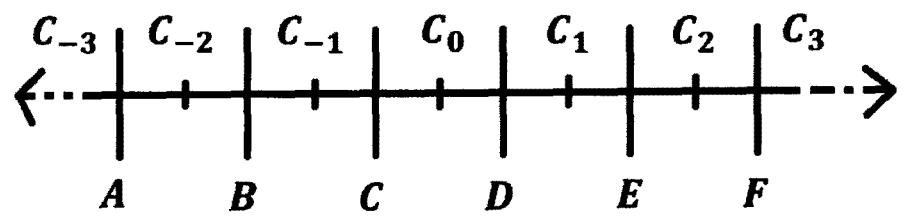
FIG. 9 is an illustration of the classification of the range for each step of adjustment of the capacitance of a capacitor arrangement of an embodiment of the filter apparatus according to the present invention.

The switching of the switches 512; 620 may correspond to steps of adjustment of the capacitance of the capacitor arrangement 128a; 128b. Each step of adjustment may have a specific and determined range of capacitance. The desired capacitance $C_x$ may be compared with these determined ranges to determine which of the different possible capacitance steps, or steps of adjustment, that should be applied. With reference to FIG. 9, an example of comparison could be as follows:

$$C_x \leq A \rightarrow C_{-3}$$

$$A < C_x \leq B \rightarrow C_{-2}$$

$$B < C_x \leq C \rightarrow C_{-1}$$

etc.

Figure 10:
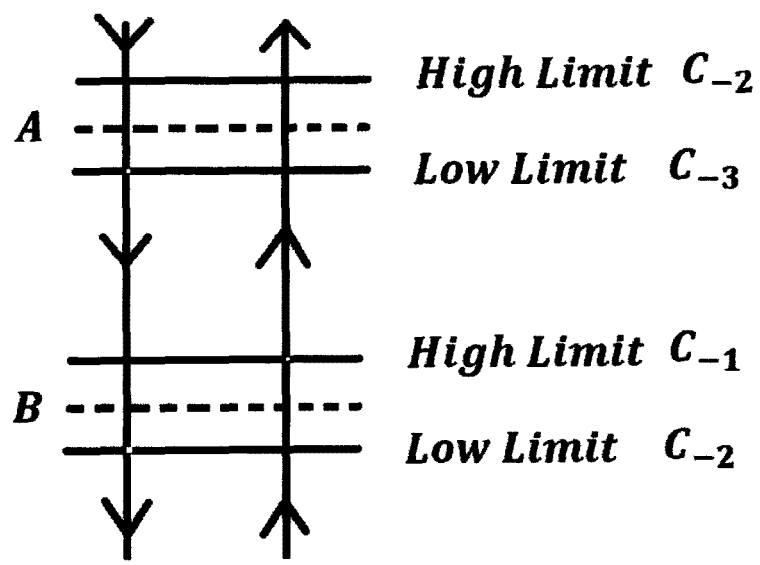
FIG. 10 is an illustration of an embodiment of the application of hysteresis between different steps of adjustment of the capacitance of a capacitor arrangement of an embodiment of the filter apparatus according to the present invention.

The correct step of adjustment can now be determined. However, to avoid unnecessary switching of the switches 512; 620 when the desired capacitance $C_x$ of the capacitor arrangement 128a; 128b is only varying in a narrow range around a specific range determination, a small hysteresis may be applied around each range determination. Unnecessary switching of the switches should be avoided in order to prevent wear of the switches and to avoid reducing the durability of the switches. Hysteresis is used to filter signals so that the output reacts more slowly by taking recent history into account. If a high limit and a low limit are determined for every step of adjustment, it is possible to apply hysteresis around every range determination. With reference to the principle illustrated in FIG. 10, depending on whether the desired capacitance $C_x$ means an increase in capacitance or a decrease in capacitance, there are two different places where the switch will close and open. If the direction of the desired capacitance $C_x$ is changing the switching points are also changing. This means that if the desired capacitance $C_x$ is varying in a narrow range around a range determination, the switches will not be triggered.

In-rush currents may be a problem by switching capacitors "back-to-back". To avoid large in-rush currents when connecting a second capacitor 510; 618, synchronous connection may be applied. Synchronous connection means that the switch 512; 620 will be triggered when the AC bus voltage is in a zero-point. Transient current will then be minimized as the voltage over the second capacitor 510; 618 and the voltage of the AC bus 105 are the same.

An issue to be addressed may be the time delay for each switch 512; 620, from trigger signal to the actual triggering. The time delay for each switch 512; 620 may be measured and compensated for. Another issue to be addressed may be the triggering of more than one switch 512; 620 at the same time, which may result in too high in-rush currents. Too high in-rush currents may in turn result in component failure. The capacitance change due to the temperature is very slow, but a fast change in frequency due to special events in the system or network will have a fast impact on the desired capacitance $C_x$. To protect the equipment from too high in-rush currents, a delay between every switching time may be provided. The delay will make sure that only one second capacitor 510; 618 at a time is connected. When there is a fast change in frequency, it may be desired to have a switching that is as fast as possible in order to catch up with the capacitance, which in turn requires a delay that is as short as possible.

The connection of a charged second capacitor 510; 618 would generate transient currents. Therefore, the controller 126, or the filter control system, may be arranged to monitor the voltage over each second capacitor 510; 618, in order to connect uncharged second capacitors 510; 618. An algorithm that aims to switch all switches 512; 620 equally often may be applied for the switches 512; 620 of the capacitor arrangement 128a; 128b according to the embodiments of FIGS. 5-6, in order to extend the time before maintenance of the filter is required. This is possible because the connection order of the second capacitors 510; 618 is not important. If it is monitored how many operations each switch 512; 620 has done, a specific algorithm of the connection order may be at least partly based thereupon.

A filter control applying the above-mentioned open loop control system is uncomplicated and robust. To be able to detect failures and other undesirable events, the above-mentioned closed loop control system is advantageous. Switches 512; 620 connecting or disconnecting on different potentials, as shown in FIGS. 5-6, is an advantage for detecting filter faults, since, for example, a short circuit of a second capacitor 510; 618 is easily detected by the controller 126, or the filter control system. The open loop control system, where temperature and frequency are measured, may be used as a primary control system, and the closed loop control system may be used as a reference and/or protection system. The open loop control system may calculate the step of adjustment of the capacitance of the capacitor arrangement 128a; 128b, and the closed loop control system may check the phase angle and verify the step of adjustment. By applying both of the open loop control system and the closed loop control system, a reliable and robust filter control is provided.

When using a filter control applying an open loop control system, external current measurements should be made in order to detect if the filter is faulty. The harmonic current for the specific filter may for example be measured. If there are any component failures, there will be a relatively large effect on the harmonic current. However, the harmonic current may decrease both for a short circuit and for problems with the switches. To detect what type of failure event has occurred, both the fundamental current and the harmonic current may be measured. The fundamental current will behave differently for different fault situations. By knowing both the fundamental and the harmonic current change, the filter control system may compensate for the problem or fault. When using a filter control applying the more complex control system by measuring the phase angle, there are some advantages in the detection of fault events. Knowing the phase angle, the control system has information on how well tuned the filter is. If there is a short circuit of a second capacitor 510; 618, the controller 126 may register a relatively fast increase or decrease of the phase angle. The controller 126, or filter control system, may then be able to compensate for the fault. By measuring the phase angle, the controller 126 or filter control system may be able to compensate for all different events that affect the filter such as alteration of component values due to ageing, solar radiation and other weather phenomena.

Embodiments of the capacitor arrangement 128a; 128b; 728 as disclosed above may also be used as a controlled or adjustable capacitor arrangement or capacitor bank, e.g. an SVC, to control or adjust the reactive effect in an electrical power transmission or distribution system, or network. Embodiments of the capacitor arrangement 128a; 128b; 728 may be used for filters filtering harmonics, e.g. harmonics of order 5 and 7, which in general are generated from the electrical power transmission or distribution system, both when HVDC Classic and HVDC Light Converters are applied. Embodiments of the capacitor arrangement 128a; 128b; 728 may be used for filters connected as series filters or as shunt filters. Embodiments of the capacitor arrangement 128a; 128b; 728 may be used for Capacitor Commutated Converters, CCC, providing an adjustable or controllable CCC capacitor arrangement.

A switch, as disclosed above, may have at least two positions, modes or states comprising a conducting mode and a non-conducting mode. In the conducting mode, which may be a closed position, the switch conducts current. In the non-conducting mode, which may be an open position, the switch breaks/interrupts the current path and the switch is substantially non-conductive and does not conduct any current.

It is to be understood that each of the above-mentioned capacitors 125; 506, 510; 614, 618; 702, 716, 718, 720, 722, 724, 726 may be built up, or formed, by a plurality of capacitor elements, or sub/section-capacitors, which may be connected in series and/or in parallel with one another in various combinations, e.g. to set the capacitance of the capacitor.

In general, High Voltage may be about 1-1.5 kV and above, e.g. 130 kV and above. However, for HVDC applications and systems, High Voltage may be about 320 kV and above, e.g. 500 kV, 800 kV or 1000 kV, and above.

The various components of the filter apparatus according to the present invention, which are connected or connectable to one another or to other units, may be electrically connected, or connectable, to one another or to other units, e.g. via electrical conductors, e.g. busbars or DC lines, and/or may be indirectly connected, or connectable, e.g. electrically or inductively, via additional intermediate electric equipment or units located and connected/connectable between the components, e.g. a transformer, another converter etc.

The invention shall not be considered limited to the embodiments illustrated, but can be modified and altered in many ways by one skilled in the art, without departing from the scope of the appended claims.

The invention claimed is:

1. A filter apparatus comprising at least one filter, each filter being tunable and comprising at least one capacitor arrangement, and the at least one capacitor arrangement comprises:
a plurality of first capacitors connected in series;
a plurality of second capacitors; and
a plurality of switches, each switch being switchable between a non-conducting mode and a conducting mode, wherein the plurality of second capacitors and the plurality of switches are arranged such that different ones of the plurality of second capacitors are connectable, by means of the plurality of switches, to different potentials of the series connection of the plurality of first capacitors in order to tune the at least one filter by adjusting a capacitance of the at least one filter,
wherein two immediately adjacent ones of the plurality of switches are directly connected in series and are located between two immediately adjacent ones of the plurality of second capacitors, and two immediately adjacent ones of the plurality of first capacitors are directly connected in series and are directly connected to a point between the two immediately adjacent ones of the plurality of switches.

2. The filter apparatus according to claim 1, wherein the at least one capacitor arrangement comprises a plurality of parallel connections directly connected in series with one another, and each respective parallel connection comprises a first capacitor of the plurality of first capacitors and at least one series connection of at least one second capacitor of the plurality of second capacitors and of a switch of the plurality of switches, in each parallel connection the first capacitor being connected in parallel with the corresponding at least one series connection.

3. The filter apparatus according to claim 2, wherein each of the plurality of first capacitors have substantially the same capacitance.

4. The filter apparatus according to claim 2, wherein each of the plurality of second capacitors have substantially the same capacitance.

5. The filter apparatus according to claim 2, wherein a capacitance of each first capacitor of the plurality of first capacitors is different from a capacitance of each second capacitor of the plurality of second capacitors.

6. The filter apparatus according to claim 1, wherein each of the plurality of first capacitors have substantially the same capacitance.

7. The filter apparatus according to claim 6, wherein each of the plurality of second capacitors have substantially the same capacitance.

8. The filter apparatus according to claim 1, wherein each of the plurality of second capacitors have substantially the same capacitance.

9. The filter apparatus according to claim 1, wherein a capacitance of each first capacitor of the plurality of first capacitors is different from a capacitance of each second capacitor of the plurality of second capacitors.

10. The filter apparatus according to claim 1, wherein each filter comprises at least one adjustable reactor connected in series with the corresponding at least one capacitor arrangement, an inductance of each of the at least one adjustable reactor being adjustable, and each of the at least one adjustable reactor is arranged to adjust a total inductance of the at least one filter.

11. The filter apparatus according to claim 1, wherein the filter apparatus comprises a controller arranged to increase the capacitance of the at least one filter by controlling the at least one filter to connect at least one of the plurality of second capacitors.

12. The filter apparatus according to claim 11, wherein the controller is arranged to select which one of the plurality of second capacitors to connect based on information on when at least one of the plurality of second capacitors was last connected.

13. The filter apparatus according to claim 11, wherein the controller is arranged to switch at least one switch of the plurality of switches to the conducting mode to increase a capacitance of the at least one capacitor arrangement for adjusting a tuning frequency of the at least one filter, and the controller is arranged to switch at least one switch of the plurality of switches to the non-conducting mode to decrease the capacitance of the at least one capacitor arrangement for adjusting the tuning frequency of the at least one filter.

14. The filter apparatus according to claim 13, wherein the controller is arranged to consecutively switch one or a plurality of the plurality of switches to the conducting mode for increasing the capacitance of the at least one capacitor arrangement, and the controller is arranged to consecutively switch one or a plurality of the plurality of switches to the non-conducting mode for decreasing the capacitance of the at least one capacitor arrangement.

15. The filter apparatus according to claim 1, wherein the filter apparatus comprises a controller arranged to decrease the capacitance of the at least one filter by controlling the at least one filter to disconnect at least one of the plurality of second capacitors.

16. The filter apparatus according to claim 1, wherein the filter apparatus is arranged to increase a capacitance of the at least one capacitor arrangement by 1-5% when one of the plurality of switches is switched to the conducting mode, and the filter apparatus is arranged to decrease the capacitance of the at least one capacitor arrangement by 1-5% when one of the plurality of switches is switched to the non-conducting mode.

17. The filter apparatus according to claim 1, wherein the at least one filter is configured for harmonic filtering.

18. An electrical power transmission or distribution system comprising at least one converter for converting alternating current, (AC) to direct current (DC) and/or direct current to alternating current, the at least one converter being connectable to a high voltage direct current (HVDC) power transmission or distribution system comprising at least one direct current transmission or distribution line for carrying direct current and connectable to a high voltage alternating current power system, wherein the electrical power transmission or distribution system comprises at least one filter apparatus as claimed in claim 1.

19. A method for filtering harmonics in an electrical power transmission or distribution system by means of a filter apparatus as claimed in claim 1, and wherein the method comprises adjusting a tuning frequency of the at least one filter by connecting or disconnecting the plurality of second capacitors on different potentials in order to adjust the capacitance of the at least one filter.

20. The method according to claim 19, wherein the step of adjusting the tuning frequency of the at least one filter comprises switching at least one of the plurality of switches to the conducting mode to increase a capacitance of the at least one capacitor arrangement or to the non-conducting mode to decrease the capacitance of the at least one capacitor arrangement.

* * * * *